US007416911B2

(12) United States Patent
Heath et al.

(10) Patent No.: US 7,416,911 B2
(45) Date of Patent: Aug. 26, 2008

(54) ELECTROCHEMICAL METHOD FOR ATTACHING MOLECULAR AND BIOMOLECULAR STRUCTURES TO SEMICONDUCTOR MICROSTRUCTURES AND NANOSTRUCTURES

(75) Inventors: James R. Heath, South Pasadena, CA (US); Yuri Bunimovich, Los Angeles, CA (US); Guanglu Ge, Pasadena, CA (US); Kristen Beverly, Pasadena, CA (US); John Nagarah, Los Angeles, CA (US); Michael Roukes, Pasadena, CA (US); Peter Willis, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 476 days.

(21) Appl. No.: 10/876,276

(22) Filed: Jun. 23, 2004

(65) Prior Publication Data

US 2005/0032100 A1      Feb. 10, 2005

Related U.S. Application Data

(60) Provisional application No. 60/480,894, filed on Jun. 24, 2003.

(51) Int. Cl.
*H01L 21/306* (2006.01)

(52) U.S. Cl. .......................... 438/49; 977/704; 977/762; 977/792; 977/794; 977/830; 977/899; 977/920; 977/924; 977/958

(58) Field of Classification Search .................. 438/99; 977/704, 762, 788–794, 814, 815, 830, 836, 977/896, 899, 904, 920, 924, 957, 958
See application file for complete search history.

(56) References Cited

U.S. PATENT DOCUMENTS 6,444,111 B1 *    9/2002   Montgomery ................ 205/334

(Continued)

FOREIGN PATENT DOCUMENTS

WO      WO 2004/012234 A2      2/2004

OTHER PUBLICATIONS

Aviram et al., Molecular Rectifiers, Chem. Phys Lett., pp. 277-283, (1974).

(Continued)

*Primary Examiner*—Richard T. Elms
*Assistant Examiner*—Michael Lulis
(74) *Attorney, Agent, or Firm*—Townsend and Townsend and Crew LLP

(57) ABSTRACT

A method by which silicon nanostructures may be selectively coated with molecules or biomolecules using an electrochemical process. This chemical process may be employed as a method for coating many different nanostructures within a circuit, each with a different molecular or biomolecular material. The density of devices within a circuit of devices that can be coated with different molecules is limited only by the ability to electronically address each device separately. This invention has applications toward the fabrication of molecular electronic circuitry and toward the fabrication of nanoelectronic molecular sensor arrays.

45 Claims, 9 Drawing Sheets

U.S. PATENT DOCUMENTS

| | | |
|---|---|---|
| 2001/0054709 A1 | 12/2001 | Heath et al. |
| 2003/0108728 A1 | 6/2003 | Heath et al. |
| 2004/0093575 A1 | 5/2004 | Heath et al. |
| 2004/0136866 A1 | 7/2004 | Pontis et al. |

OTHER PUBLICATIONS

Cicero et al., Photoreactivity of Unsaturated Compounds with Hydrogen-Terminated Silicon (111), Langmuir, vol. 16, pp. 5688-5694,(2000).

Cui et al., Nanowire Nanosensors for Highly Sensitive and Selective Detection of Biological and Chemical Species, Science, 293, 1298 (2001).

Fodor et al., "Light-directed, spatially addressable parallel chemical synthesis," Science 251, 767-773 (1991).

Hodneland et al., Design of Self-Assembled Monoplayers that Release Attached Groups Using Applied Electrical Potentials, Langmuir, vol. 13, No. 23, pp. 6001-6003 (1997).

Kim et al., Electrochemical Deprotection for Site-Selective Immobilization of Biomolecules, Langmuir vol. 18, pp. 1460-1462 (2002).

Kwon et al., Dependence of the Rate of an Interfacial Diels—Alder Reaction on the Steric Environment of the Immobilized Dienophile: An Example of Enthalpy—Entropy Compensation, J. Am. Chem. Soc. 124, No. 5, pp. 806-812 (2002).

Luo et al., Molecular Electronics Random Access Memory Circuits, Chem. Phys. Chem 2002(3), p. 519.

Melosh et al., Ultrahigh-Density Nanowire Lattices and Circuits, Science, vol. 300, pp. 112-115, Apr. 2003.

Metzger et al., J. Phys. Chem. B107, 1021 (2003).

Piner et al., Dip-Pen, Nanolithogrpahy, Science, vol. 283, pp. 661-663, 1999.

Terry et al., Alkyl-terminated S1 (111) Surfaces: A high-resolution, core level photoelectron spectroscopy study, Journal of Applied Physics, vol. 85, No. 1, pp. 213-221, (1999).

Wagner et al., Bioreactive Self-Assembled Monolayers on Hydrogen-Passivated Si(111) as a New Class of Atomically Flat Substrates for Biological Scanning Probe Microscopy, Journal of Structural Biology 119, Article No. SB973881, pp. 189-201 (1997).

Yousaf et al., The Kinetic Order of an Interfacial Diels-Alder Reaction Depends on the Environment of the Immobilized Dienophile, Angew. Chem. vol. 112, No. 11, pp. 2019-2022 (2000).

Yousaf et al., Diels-alder Reaction for the Selective Immobilization of Protein to Electroactive Self-Assembled Monolayers, J. Am. Chem. Soc. 121, pp. 4286-4287 (1999).

Qian et al., Arrays of Self-Assembled Monolayers for Studying Inhibition of Bacterial Adhesion, Anal. Chem. 74, pp. 1805-1810 (2002).

Sieval et al., Highly Stable Si-C Linked Functionalized Monolayers on the Silicon (100) Surface, Langmuir, vol. 14, No. 7, pp. 1759-1768 (1998).

* cited by examiner

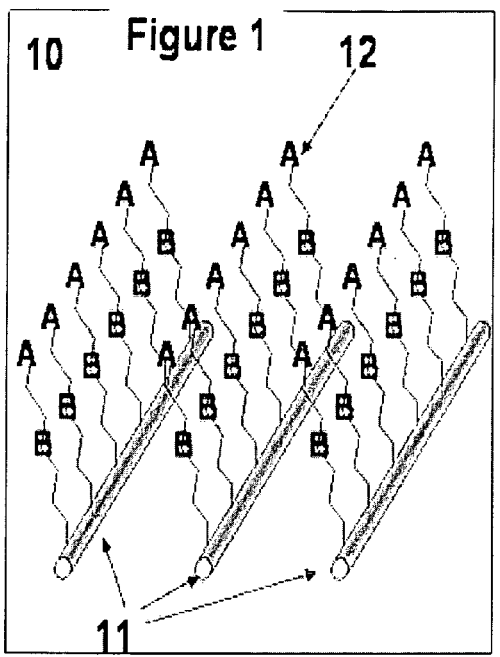
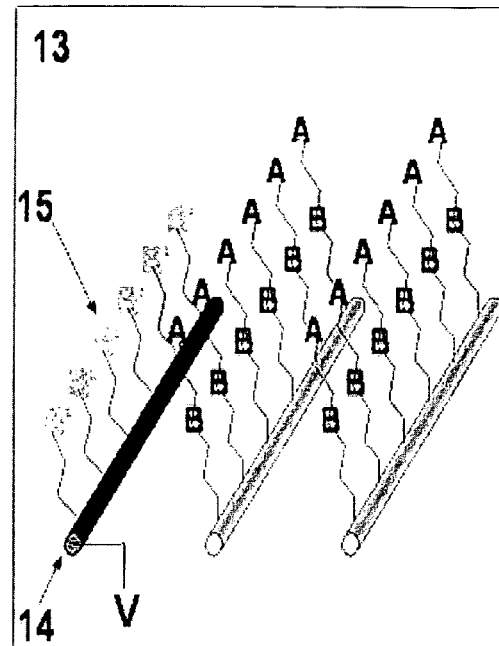
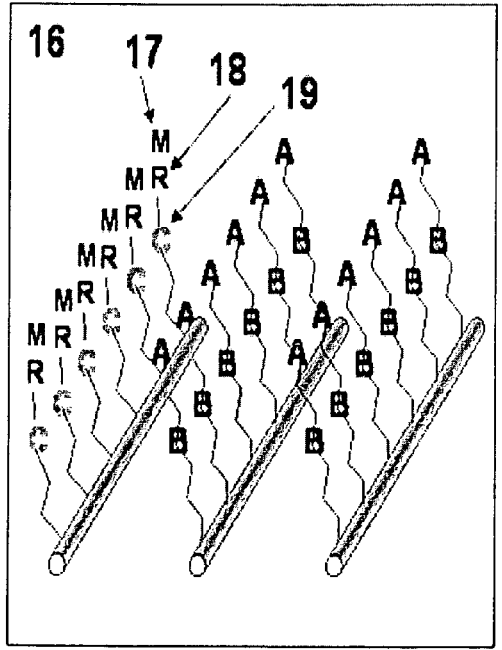
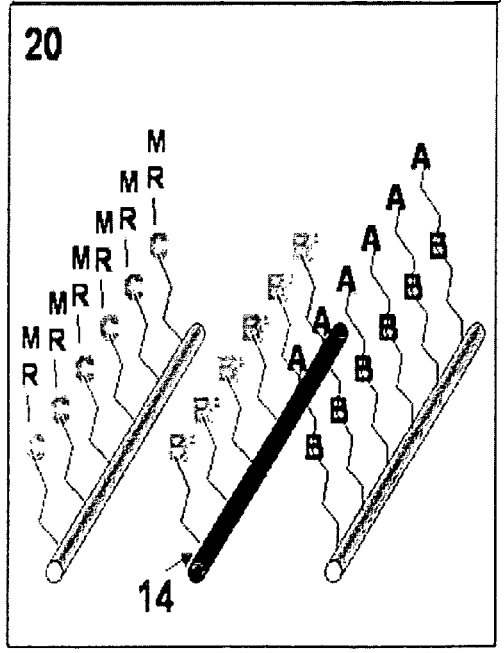
Figure 1

ELECTROCHEMICAL METHOD FOR ATTACHING MOLECULAR AND BIOMOLECULAR STRUCTURES TO SEMICONDUCTOR MICROSTRUCTURES AND NANOSTRUCTURES

CROSS-REFERENCES TO RELATED APPLICATIONS

This application claims benefit under 35 USC §119(e) of U.S. Provisional Application No. 60/480,894, filed on Jun. 24, 2003.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to micro or nanostructures and their applications. More particularly, the present invention provides methods and resulting structures for forming molecular probes onto nano and micro structures for a wide variety of applications. As merely an example, such molecular probes have been used in life science applications. Accordingly, the present invention can enable researchers and scientists to identify promising candidates in the search for new and better medicines, for example, in screening, therapeutics, drug discovery, and development. But it would be recognized that the invention has a much broader range of applicability. The present invention may be used for other applications such as biochemical, electronics, chemical, medical, petrochemical, security, business, and the like.

Over the years, microelectronics have proliferated into many aspects of modern day life. In the early days, Robert N. Noyce invented the integrated circuit, which is described in "Semiconductor Device-and-Lead Structure" under U.S. Pat. No. 2,981,877. Integrated circuits evolved from a handful of electronic elements into millions and even billions of components fabricated on a small slice of silicon material. Such integrated circuits have been incorporated into and control many conventional devices, such as automobiles, computers, medical equipment, and even children's toys. Although the integrated circuit has been highly successful, there is still a need for developing other types of technologies for other applications. An example of such technology includes molecular electronics.

Molecular electronics constitutes an area of research in which molecular components are incorporated into electrical devices. Additionally, the characteristics of those electrical devices are altered in what are often interesting and useful manners by those molecules. Certain examples of molecular electronics exist. One example includes molecular electronic random access memory circuits. See, Yi Luo, C. P. Collier, Kent Nielsen, Jan Jeppesen, Julie Perkins, Erica Delonno, Anthony Pease, J. Fraser Stoddart, and James R. Heath, "Molecular Electronics Random Access Memory Circuits," Chem Phys Chem 2002(3), 519 (2002). In such example, a bistable molecular switch has been exploited as a mechanism for storing '1's and '0's. While this circuit operates in a manner that is similar to a more conventional random access memory circuit, it has the advantage that switching characteristics arise from a molecular property, and so, in principle, individual memory element within the circuit should scale to the dimensions of a few molecules.

Another example is a molecular rectifier. See, A. Aviram and M. Ratner, "Molecular Rectifiers," Chem. Phys Lett., 1971; R. M. Metzger, et al., J. Phys. Chem. B107, 1021 (2003). The molecular rectifier in which current rectification, or diode character, is built into a device through control of the molecular component. Yet another example is a nanowire molecular or biomolecular sensor. See, Yi Cui, Qingqiao Wei, Hongkun Park and Charles M. Lieber, "Nanowire nanosensors for highly sensitive and selective detection of biological and chemical species," Science, 293, 1298 (2001). If the nanowire is sufficiently small (1 to 30 nanometers in diameter), then the electrical properties of the nanowire depend not just on the materials construction of the nanowire, such as doping level, physical dimensions, etc., but also on the chemical environment surrounding the nanowire Thus, the nanowire can also serve as a chemical sensor. Such a nanowire sensor can be customized for certain sensing tasks by chemically coating the surface of the nanowire with a molecular probe, such as an antibody for some molecular target, such as a particular protein. When the nanowire is exposed to a solution containing that protein, the protein binds to the nanowire sensor surface by binding to the antibody. The chemical environment surrounding the nanowire is modified by this target/probe binding event, and thus so are the electrical properties of the nanowire. Thus, the presence of the protein may be detected. Although molecular electronics have been successful, there are still many limitations.

From the above, it is seen that improved techniques for manufacturing molecular electronics and applications are highly desirable.

BRIEF SUMMARY OF THE INVENTION

According to the present invention, techniques directed to micro or nanostructures and their applications are provided. More particularly, the present invention provides methods and resulting structures for forming molecular probes onto micro and nanostuctures for a wide variety of applications. As merely an example, such molecular probes have been used in life science applications. Accordingly, the present invention can enable researchers and scientists to identify promising candidates in the search for new and better medicines, for example, in screening, therapeutics, drug discovery, and development. But it would be recognized that the invention has a much broader range of applicability. The present invention may be used for other applications such as biochemical, electronics, chemical, medical, petrochemical, security, business, and the like.

In a specific embodiment, the present invention provides a method by which silicon nanostructures may be selectively coated with molecules or biomolecules using an electrochemical process. This electrochemical process may be employed as a method for coating many different nanostructures within a circuit, each with a different molecular or biomolecular material. In a specific embodiment, the silicon micro or nano structures have a dimension ranging from no greater than about thirty micrometers to about five nanometers. The density of devices within a circuit of devices that can be coated with different molecules is limited only by the ability to electronically address each device separately. This invention has applications toward the fabrication of molecular electronic circuitry and toward the fabrication of nano-electronic electronic molecular sensor arrays.

In a specific embodiment, the present invention provides a method for manufacturing molecular probes on semiconductor micro or nanostructures, e.g., silicon wafer. The method includes providing at least one micro or nanostructure, which has a surface region. The method includes processing the surface region to form a hydrogenated surface (e.g., Si—H) on a portion of the surface region of the micro or nanostructure and forming one or more electroactive molecules overlying the surface region of the micro or nanostructure. Preferably, the electroactive molecules are precursor molecules according to a specific embodiment.

In an alternative specific embodiment, the present invention provides a method for manufacturing molecular probes on semiconductor nanostructures. The method includes providing a plurality of nanowires structures, which includes a semiconductor material, e.g., silicon wafer. Each of the nanowire structures comprises a surface region. The method includes forming a precursor layer including electroactive molecules overlying the surface region of each of the nanowire structures and immersing the plurality of nanowire structures in a fluid, which is preferably an electrolyte including a plurality of particular molecules. The method selectively applies an electrical voltage to one or more of the nanowires from the plurality of nanowires to change a potential of the selected nanowire or nanowires. The method also includes forming one or more reactive sites on the surface region of the selected one or more nanowire structures from the plurality of nanowires structures. The method also initiates one or more chemical bonds between one end of a electroactive molecules from a plurality of electroactive molecules to at least one of the reactive sites through the fluid. Preferably, the method continues to apply the particular molecules to the surface region of the one or more selected nanowire structures.

In an alternative specific embodiment, the present invention provides a semiconductor based micro or nano probe device. The device has a semiconductor substrate and a plurality of nano or micro wires formed on the semiconductor substrate. Each of the nano or micro wires has contact region and a surface region. Preferably, the contact region is for electrical contact to a source voltage. The device has a substantially oxide free surface region on each of the plurality of nano or micro structures and a precursor formed overlying the substantially oxide free surface region on each of the plurality of nano or micro structures. A voltage source is coupled to each of the contact regions on each of the plurality of nano or micro structures. The voltage source selectively applies a potential to one or more of the contact regions to change a state of the precursor from a first state to a second state.

In yet an alternative embodiment of the present invention, the present invention provides a programmable semiconductor based molecular probe device. The device has a semiconductor substrate, e.g., silicon wafer. The device has a plurality of nano or micro sized regions formed on the semiconductor substrate. The plurality of nano or micro sized regions is numbered from 1 to N, where N is an integer greater than 1. A precursor molecule is formed on each of the plurality of nano or micro sized regions on the semiconductor substrate. One or more voltage sources is coupled to each of the plurality of nano or micro sized regions on the semiconductor substrate. The one or more voltage sources selectively applies voltage to any one or more of the plurality of nano or micro sized regions to attract a particular molecule species to the one or more of the plurality of nano or micro sized regions.

For these and other applications of molecular electronics, components that changes across the various different device types are the molecule. In fact, in many instances, different circuits, but with identical circuit architectures, can be employed for different tasks (logic, memory, sensing, etc.), depending upon the specific molecule or class of molecules that are employed. This application has been illustrated for the case of an array of nanowire sensors. If each nanowire is coated with the same molecular probe, then each nanowire is customized to detect and identical molecular target or class of targets. If, on the other hand, each nanowire is coated with a different molecular probe, then the number and/or diversity of chemical species that can be sensed is generally limited only by the number of separate nanowire elements making up the array of nanowire sensors. In principle, the number of array elements can be large, and the density of the array can be high.

For example, silicon nanowires of diameters from 5 to 30 nm are desirable chemical sensors, and also desirable conducting elements for molecular electronic random access memory circuits. Patterning techniques for fabricating ultra-dense arrays of such small diameter nanowires have been reported. The published limits of such patterns are 8 nm diameter nanowires at a pitch (the separation distance between central axis of two adjacent nanowires) of 16 nanometers. See, N. Melosh, Akram Boukai, Frederic Diana, Brian Geradot, Antonio Badolato, Pierre Petroff, and James R. Heath, "Ultrahigh density Nanowire Lattices and Circuits," *Science,* 300, 112 (2003). According to a specific embodiment of the present invention, we have provided applications to these ultra dense arrays as have been described throughout the present specification and more particularly below.

Many benefits are achieved by way of the present invention over conventional techniques. For example, the present technique provides a process that is compatible with conventional process technology without substantial modifications to conventional equipment and processes. Preferably, the invention provides a technique where individual micro or nanowires, or groups of micro or nanowires, can be coated with different molecules or biomolecules according to a specific embodiment. More preferably, the invention provides a method including an ability to electrically address individual devices within an integrated circuit containing many device types, among other features. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 1 is a simplified diagram illustrating an electrochemical method for attaching molecular and biomolecular structures to semiconductor nanostructures or microstructures.

DETAILED DESCRIPTION OF SPECIFIC EMBODIMENTS

Figure 2:
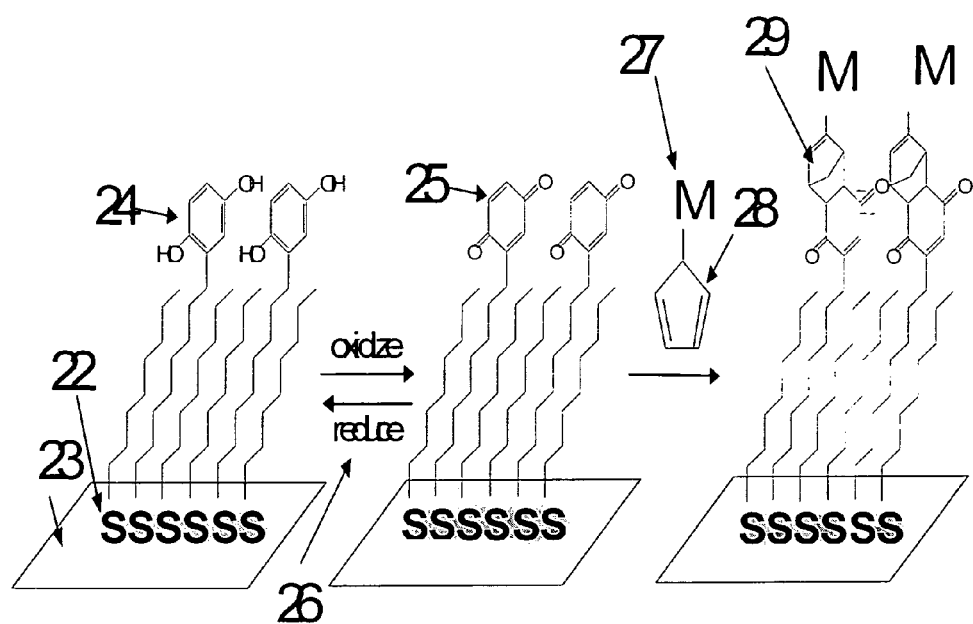
FIG. 2 is a simplified diagram illustrating a conventional method of Hodenland and Mrksich.

According to the present invention, techniques directed to micro or nanostructures and their applications are provided. More particularly, the present invention provides methods and resulting structures for forming molecular probes onto micro and nanostuctures for a wide variety of applications. As merely an example, such molecular probes have been used in life science applications. Accordingly, the present invention can enable researchers and scientists to identify promising candidates in the search for new and better medicines, for example, in screening, therapeutics, drug discovery, and development. But it would be recognized that the invention has a much broader range of applicability. The present invention may be used for other applications such as biochemical, electronics, chemical, medical, petrochemical, security, business, and the like.

Before describing the details of the specific embodiments of the present invention, we have provided certain definitions that may assist the reader of this present patent specification. These definitions are merely intended to assist the reader in understanding certain terms as they may relate to certain inventions without unduly limiting the scope of the invention defined by the claims herein. Additionally, these definitions are not intended to be completely comprehensive in any manner and are merely provided as examples. One of ordinary skill in the art would recognize many variations, modifications alternatives.

Molecular Probe: A molecular probe is a molecule that is designed to recognize, through some chemical interactions, another molecule or class of molecules. For example, a single stranded DNA oligomer will recognize and bind to the exact complementary oligomer, according to well known rules. As second example, a particular protein will bind to a particular antibody with high selectivity. As a third example, and acidic molecule will interact chemically with basic molecules. As a fourth example, hydrophilic molecules will interact preferentially with hydrophilic molecules. Depending upon the embodiment, other examples of definitions also exist.

Molecular Target: A molecular target is a molecule, or class of molecules, that interacts preferentially and selectively with a particular molecular probe according to an embodiment of the present invention. Depending upon the embodiment, other examples also exist.

Device: A device in this context refers to an electrically addressable unit that performs some task, such as switching, storing a single bit of information, or sensing a particular molecule or class of molecules according to an embodiment of the present invention. Depending upon the embodiment, other examples of definitions also exist.

Circuit: A circuit in this context refers to a group of devices, each of which are designed to carry out similar tasks according to a specific embodiment. For example, a transistor is a switching device. A multiplier is a logic circuit constructed from many transistors, which is a circuit. As another example, a nanowire is a chemical sensing device. An array of nanowires each coated with a different molecular probe, constitutes a sensor circuit designed to sense many different molecular targets according to a specific embodiment. Depending upon the embodiment, other examples of definitions also exist.

Integrated Circuit: An integrated circuit in this context refers to a group of circuits, each design to carry out different specific tasks, but operating together to perform some larger function. For example, a multiplier circuit can retrieve two numbers from a memory circuit, multiply them together, and store them back into the memory circuit. Depending upon the embodiment, other examples of definitions also exist.

Electroactive molecule(s): An electroactive molecule in this embodiment refers to any organic molecule that is able to undergo an electrochemical reaction. Upon which one or more electrons are either added to or removed from the molecule, converting it into a different oxidative state. For example, 1,4-Benzoquinone is an electroactive molecule that can be converted to hydroquione upon the reduction of the molecule with an addition of two electrons and two proton according to a specific embodiment. Depending upon the embodiment, other examples of definitions also exist.

Precursor: A species or molecule(s) that can attach themselves to a semiconductor material and that contains a terminal electroactive species according to a specific embodiment. The species or molecule has at least a first state and a second state (once attached to the semiconductor material) upon application of an electrical potential, as an example. The first state corresponds to a reactive state and the second state corresponds to a non-reactive state. The reactive state allows for reaction and attachment with a selected species (e.g., protein, DNA) and the non-reactive state allows for non-reaction with the same selected species. According to a preferred embodiment, the precursor is an R-group that has characteristics of being able to attach to silicon bearing surfaces and containing an electroactive group or species. Of course, other definitions may also exist.

As noted, the above definitions have been provided as a way to assist the reader of this application. There can be other variations, modifications, and alternatives. Specific descriptions regarding the present invention can be found throughout the present specification and more particularly below.

A method for fabricating one or more molecular probes using one or more respective nanowires (or microwires) according to an embodiment of the present invention may be outlined as follows:

1. Provide a plurality of silicon based nanowire (or microwire) structures;
2. Coat each of the nanowire structures with a precursor molecule;
3. Immerse the plurality of nanowire structures into an electrolyte solution containing a reference and a counter electrode as in a common electrochemical cell;
4. Select via application of electrical voltage with respect to a reference electrode one or more wires or set of wires within the plurality of nanowire structures;
5. Form one or more reactive sites on the selected one or more wires or set of wires by electrochemically changing the precursor molecule(s) on the one or more nanowires;
6. Initiate one or more chemical bonds between one end of the electroactive molecule to one or more particular molecules (and/or complementary reactive species, biological species) that react with a predetermined state of the precursor molecules generated in steps (4) and (5) and that may or may not contain a probe molecule;
7. Continue with step (6) until the selected one or more wires has been coated with the particular molecules that may or may not contain a probe molecule;
8. Deselect the one or more selected wires;
9. Perform steps (2) through (8) for another one or more wires or set of wires for one or more different molecules to be selectively attached to the precursor layer;
10 Continue step (9) until a desired number of wires or each of the plurality of nanowires have been coated with the one or more different molecules that are desirable for achieving the appropriate functions; and
11. Perform other steps, as desired.

The above sequence of steps provides a method according to an embodiment of the present invention. As shown, the method uses a combination of steps including a way of forming a plurality of nanowires coated with selected electroactive molecules for specific applications. Such applications may include life sciences, etc. The nanowires with selected electroactive molecules are now programmed via electrochemical techniques for such applications. Additionally, the method can also be applied to microwires and other applications. Other alternatives can also be provided where steps are added, one or more steps are removed, or one or more steps are provided in a different sequence without departing from the scope of the claims herein. Further details of the present method can be found throughout the present specification and more particularly below.

FIG. 1 is a simplified diagram illustrating an electrochemical method for attaching molecular and biomolecular structures to semiconductor nanostructures or microstructures. This diagram is merely an example, which should not unduly limit the scope of the claims herein. One of ordinary skill in the art would recognize other variations, modifications, and alternatives. As shown, in step 10 some or all of the wires within a circuit 11 are coated with a precursor molecule 12 or other like molecule. The wires can be a plurality nanowires, microwires, or the like. As merely an example, the nanowires and their construction have been described Superlattice Nanopatterning of Wires and Complex Patterns listed under International Publication Number WO 2004/012234 A2, in the name of James Heath, et al. In a specific embodiment, the wire or wires can be made of a silicon based material such as single crystal silicon, which is doped with an impurity. The wire or wires can also be made using other types of semiconductor materials, e.g., germanium, Group III/V. Of course, the type of material and characteristic of the wire would depend highly upon the application.

In a specific embodiment, the precursor molecule has certain desirable properties. That is, the precursor molecule can be any electroactive species capable of having at least a first state and at least a second state depending upon a level of applied voltage according to an embodiment of the present invention. The second state allows for a non-reaction with a certain reactive (or complementary, biological) molecule and the first state allows for a reaction with the certain molecule to provide selectivity toward the electroactive molecule that is in the preferred state according to an embodiment of the present invention. In a specific embodiment, the electroactive molecule can be defined by a general class of quinone species or derivatives, but is not limited to these species or derivatives. Of course, depending upon the specific application, there can also be other types of electroactive molecules. The electroactive molecules and applications will be described throughout the present specification and more particularly below.

In another step 13, the circuit is immersed into an electrolyte solution containing the particular reactive molecule (or molecular electronic molecule, which are used interchangeably) 17, which is the molecule of interest for a particular molecular electronics application. The reactive molecule can be selected from any suitable species that has attachment characteristics toward the precursor molecule while in one state but not the other state according to a specific embodiment. The electrolyte solution can include any solution having acidic or basic characteristics and capable of allowing an electric current to traverse there through and acts as a transport medium for the reactive molecules and/or other species. Preferably, the solution is a liquid, gas, vapor, any combination of these and others. Of course, one of ordinary skill in the art would recognize many variations, alternatives, and modifications.

When an individual wire 14 or set of wires within this circuit is electrically addressed by selectively applying a voltage to it while being immersed in the fluid, the precursor molecule is electrochemically modified, forming a reactive site on the nanowire 15. In a specific embodiment, the voltage has been applied to the selected wire or wires via direct connection to or coupling to a first polarity of a power source. The second or opposite polarity of the power source is coupled or connected to a counter electrode suspended in the electrolyte solution and spatially disposed away from the individual wire or set of wires (similar to a set up in a plating tank). Preferably, the precursor molecule can be in the first state and at least the second state, which would include the reactive site. The reactive molecule 17 has been previously prepared so that one end of it 18 will preferentially form a chemical bond 19 to this reactive site 15. In step 16, this reaction proceeds so that the particular wire 14 is coated with the reactive molecule 17. The term coated can be partially and/or completely forming a layer overlying a portion or an entirety of the particular wire according to a specific embodiment. To stop or conclude the reaction, the voltage on the particular wire is removed.

In step 20, another wire 14 or set of wires is similarly electronically addressed and coated with a different reactive molecular. This procedure is carried out until one or more or all of the nanowires in the circuit are coated with the particular reactive molecules that are necessary for achieving the appropriate functions. That is, the present method provides a way of programming the array of wires using different reactive molecules (e.g., molecules that may or may not contain biological probes) that are designed for specific applications. Further details of the present invention can be found throughout the present specification and more particularly below.

Before describing details of the present invention including specific embodiments, we will briefly review the various conventional techniques and the limitations that we have discovered. Although these techniques are in the prior art, we have uncovered the limitations described herein. Details of these limitations and conventional techniques are provided below.

Molecules have been conventionally incorporated into molecular electronic devices using various approaches, including depositing Langmuir monolayers from a Langmuir-Blodgett trough in which the amphiphilic molecules are spread at an air water interface. This film of molecules is then transferred to the substrate containing, for example, the bottom circuit electrodes, and then additional top electrodes are subsequently deposited. This method allows for the deposition of a uniform monolayer with a high level of control, but is limited to amphiphilic molecules, and the molecules are not deposited in any spatially selective fashion. Lithographic techniques can be used in conjunction with Langmuir techniques could, in principle, be utilized to generate some spatial selectivity, but such methods have not been demonstrated.

Another conventional approach has been to utilize the chemical bonding interactions between certain molecular functional groups and metal or semiconductor surfaces. Such functional groups and their corresponding surfaces include amines (R—$NH_2$) and platinum (Pt), thiols (R—SH) and Au, carboxylates (R—$CO_2$— or R—$CO_2H$) and Al or $Al_2O_3$, chloro-silanes (R—$SiCl_3$) and $SiO_2$, methoxy-silanes (R—Si($OCH_3$)$_3$ and $SiO_2$, and others. This method of forming chemically bonded molecular monolayers does not naturally lend itself to being spatially selective. For example, if silicon nanowires, passivated with the native insulating $SiO_2$ layer, are deposited onto a platinum (Pt) substrate, then organic amines can be utilized to selectively deposit one organic component onto the Pt substrate, and organo-methoxysilanes can be utilized to deposit a second organic group onto the Si nanowires. However, each Si nanowire will be identically coated, which leads to limitations.

Spatially selective methods have been demonstrated for the fabrication of, for example, gene and protein chips. For gene chips, photolabile molecular precursors are deposited uniformly onto a substrate, and ultra-violet irradiation is used to selectively active certain regions of that substrate. See, S. P. A. Fodor, J. L. Read, M. C. Pirrung, L. Stryer, A. T. Lu, and D. Solas, "Light-Directed, Spatially Addressable Parallel Chemical Synthesis," Science, v. 251 p. 767 (1992). Molecules will then selectively bind to those activated regions, and in this way a gene chip can be constructed. Here the chemistry is spatially selective, but is limited to the resolution of optical wavelengths, which is about 1-2 square micrometers. This resolution is much coarser than the density of nanowires in a nanowire sensor array that can be achieved.

Another alternative has been to utilize inkject technologies to 'spot' substrates in particular regions. This method is also limited to a resolution of 1-2 square micrometers. Another alternative has been to utilize dip-pen lithography to 'spot' substrates in particular regions. See, R. D. Piner, J. Zhu, F. Xu, S. Hong, and C. Mirking, "'Dip-Pen' Nanolithography" Science 283:661-63 (1999). This is similar in concept to the ink-jet method, but is a higher resolution method. In this method, a micrometer-scale cantilever is utilized as a writing pen, and the molecules of interest are utilized as the ink. This method does not assure high quality molecular films, especially for the smallest features, and it is also, by its nature, a relatively slow method that is not amenable to wafer scale fabrication. It is also quite difficult to align the dip-pen cantilevers with the underlying substrate features.

More relevant to the present inventions are electrochemical methods for carrying out spatially selective chemistries on gold substrates. At least two different electrochemical reaction approaches for selectively attaching molecules to voltage-activated gold substrates have been developed. Such approaches include those described by Christian D. Hodenland and Milan Mrksich, "Design of Self-Assembled Monolayers that Release Attached Groups using Applied Electric Potentials," Langmuir, v. 13, p. 6001 (1997) and Kyuwon Kim, et al., "Electrochemical Deprotection for Site-Selective Immobilization of Biomolecules," Langmuir, v. 18, p. 1560 (2002)]. In each case, precursor molecules are coated onto gold substrates 23 by taking advantage of the chemical bond that forms between gold and organothiol groups 22. Hodenland and Mrksich's method has been illustrated in FIG. 2. They bonded a hydroquinone molecule 24 to the gold substrate. By applying an oxidating voltage to the gold substrate 23, the hydroquinone may be electrochemically modified to form a quinone 25, and this reaction may be reversed 26 by applying a reducing voltage to the gold substrate. The chemical reactivity of the quinone group 25 makes it susceptible to reaction with cyclopentadiene, using a Diels-Alder reaction. Thus, a molecule 27 containing a cyclopentadiene functionality 28 on one end will react with and form a chemical bond to the quinone 29. Although somewhat successful, the Hodenland and Mrksich method has certain limitations, which are described throughout the present specification and in more detail below.

Figure 3:
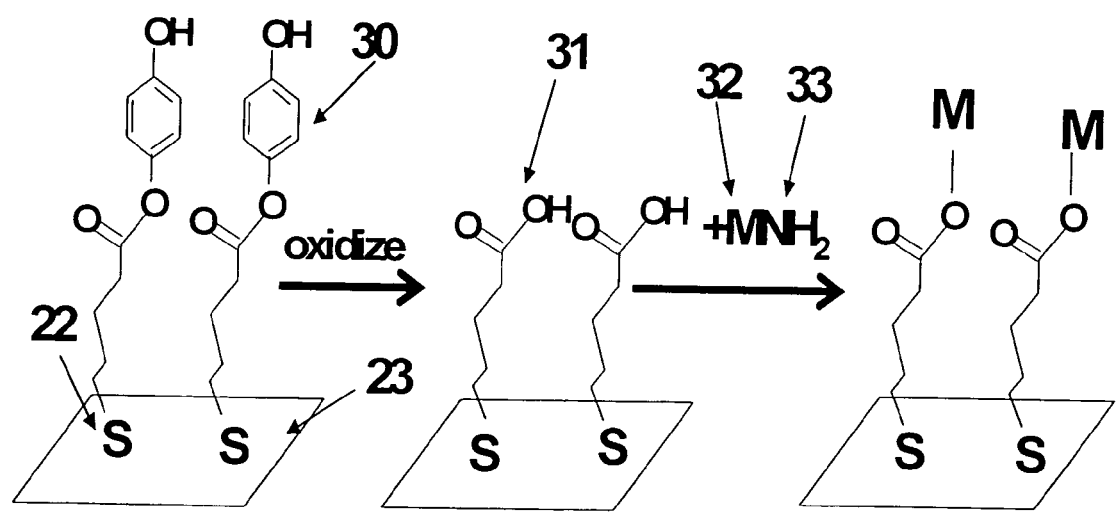
FIG. 3 is a simplified diagram illustrating a conventional method of Kyuwon and coworkers.

Kyuwon and coworkers' method is illustrated in FIG. 3. They also coated gold substrates 23, but with the hydroquinone monoester of thioctic acid as the precursor molecule 30. When an oxidizing potential is applied to this substrate, the precursor molecule effectively breaks, leaving behind a carboxylate group 31 that is still bound to the gold substrate through the same sulfur-gold linkage 22. Unlike the electrochemical activation reported by Hodenland and Mrksich, the electrochemical activation of Kyuwon and coworkers is not reversible. The chemical reactivity of the carboxylate groups makes is susceptible to amide coupling chemical reactions. Thus, a molecule 32 containing an amine group on one end 33 will react with and form a chemical bond to the activated molecule bonded to the gold substrate. Although somewhat successful, each of these techniques have been limited to gold coated substrates and have other limitations. These and other limitations of these conventional techniques have been addressed using the present invention, which will be described in more detail throughout the present specification and more particularly below.

According to a specific embodiment of the present invention, we describe a method for modifying the chemical methods of Hodenland and Mrksich (HM), Kyuwon and coworkers (Kc), and other chemistries for the selective coating of semiconductor nanowires for molecular electronics applications. Extending the chemistries of HM and Kc for use toward selectively coating semiconductor nanowires for molecular electronics applications required significant modification in those chemistries. First, we discuss how the nature of the semiconductor surface generally requires this chemistry to be modified.

According to an embodiment of the present invention, the method and resulting structures include semiconductor nanowires that serve as an electrochemical electrode. Such semiconductor nanowires often include resistive oxide coatings thereon. For the gold substrates used by both HM and Kc, this is not a problem, since those substrates are naturally conducting. Semiconductor nanowires, however, typically form insulating oxides at their surfaces. Silicon, the most commonly used semiconductor material, is a prime example of such a material. Silicon will naturally react with the oxygen in an ambient environment to form a $SiO_2$ passivated surface. Since $SiO_2$ is an insulator, it can prevent the silicon nanowire from acting as an electrochemical electrode, since the electrode surface should be a conductor. In addition, for the molecular electronic application of chemical sensing, the $SiO_2$ layer provides a spatial barrier that separates the target/probe chemical event from the nanowire conductor. This has the effect of reducing the sensitivity of the nanowire sensing element. Thus, in order to both utilize the silicon nanowire as an electrochemical electrode, and in order to maximize the sensitivity of a silicon nanowire molecular electronic sensor device, it is desirable to remove the $SiO_2$ insulating layer and bind the precursor molecule directly to the Si nanowire conductor. Preferably, the silicon nanowire structure is free from overlying insulating oxide layers that allow for the structure to be reactive according to a specific embodiment.

There are multiple chemical methods for removing the $SiO_2$ oxide from the silicon surface and then binding molecules directly to the Si conductor according to an embodiment of the present invention. For example, the $SiO_2$ may be removed using hydrofluoric acid, commonly called hydrofluoric acid (HF) acid or buffered HF acid (BHF or BOE- "buffered oxide etch"), thereby leading to silicon surface that is terminated in Si—H bonds. This surface, when irradiated with ultraviolet light, may be chemically reacted with a terminal alkene (the $H_2C=CH$—R double bond) to form a Si—$CH_2$—$CH_2$—R chemical linkage. Conversely, exposure of the Si—H surface to $Cl_2$ gas will result in a Si—Cl terminated surface. This may be reacted with $((HO)_3$—Si—R) molecules, which leads to a Si(surface)-O—Si$(OH_2)$—R. In each case, the R group may serve as the precursor molecule 12 according to a specific embodiment. Of course, there may be other variations, modifications, and alternatives. Details of a method of fabricating molecular probes using such precursor molecule can be found throughout the present specification and more particularly below.

A method for fabricating one or more molecular probes using one or more respective nano (or micro) wires according to an embodiment of the present invention may be outlined as follows:

1. Provide a plurality of silicon based nanowires structures;
2. Perform an oxide etch on the silicon based nanowire structures to form Si—H bonds on the surfaces of the nanowire structures;
3. Coat each of the nanowire structures with a precursor molecule, including an electroactive site;
4. Immerse the plurality of nanowire structures into an electrolyte solution containing a reactive molecule, which is the molecule of interest for a particular molecular electronics application;
5. Select via application of electrical voltage one or more wires or set of wires within the plurality of nanowire structures;
6. Form one or more reactive sites on the selected one or more wires or set of wires by electrochemically changing the precursor molecule(s) on the one or more nanowires;
7. Initiate one or more chemical bonds between one end of the electroactive molecule to one or more of the reactive sites of the reactive molecule in solution;
8. Continue with steps (5) through (7) until the selected one or more wires has been coated with the molecule of interest;
9. Deselect the one or more selected wires;
10. Perform steps (2) through (9) for another one or more wires or set of wires for one or more different reactive molecule;
11 Continue step (10) until a desired number of wires or each of the plurality of nanowires have been coated with selected reactive molecules that are desirable for achieving the appropriate functions;
12. Selectively applying a molecule onto one or more of the plurality of nanowires coated with the selected reactive molecules, i.e., probe molecules;
13. Detect the applied molecule on the one or more of the plurality of nanowires coated with the selected reactive molecules; and
14. Perform other steps, as desired.

The above sequence of steps provides a method according to an embodiment of the present invention. As shown, the method uses a combination of steps including a way of forming a plurality of nanowires coated with selected electroactive molecules for specific applications. Such applications may include life sciences, etc. The selected electroactive molecules are preferably used to form an array of probe molecules or molecules of interest. Such probe molecules are provided for detecting a variety of molecular, biomolecular, and chemical species, depending upon the specific embodiment. Additionally, the method can also be applied to microwires and other applications. Other alternatives can also be provided where steps are added, one or more steps are removed, or one or more steps are provided in a different sequence without departing from the scope of the claims herein. Further details of the present method can be found throughout the present specification and more particularly below.

Figure 4:
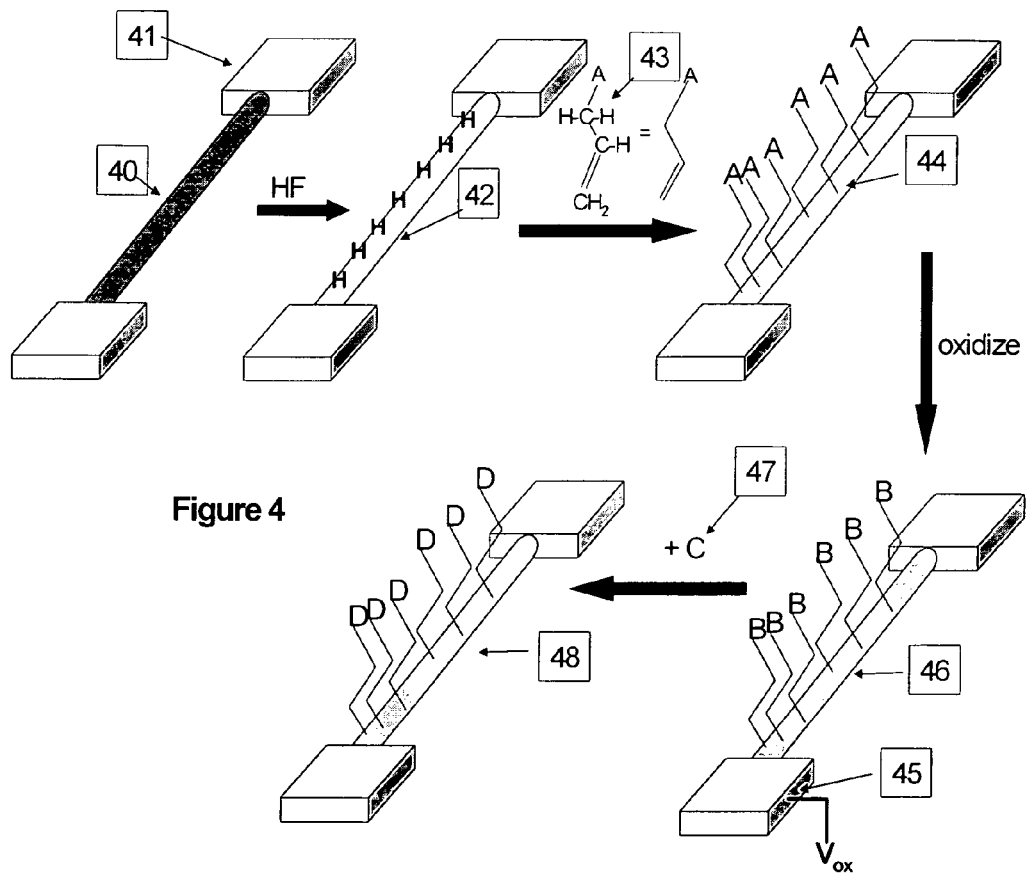
FIG. 4 is a simplified diagram of selectively coating a silicon nanowire with a molecule of interest according to an embodiment of the present invention.
Figure 5:
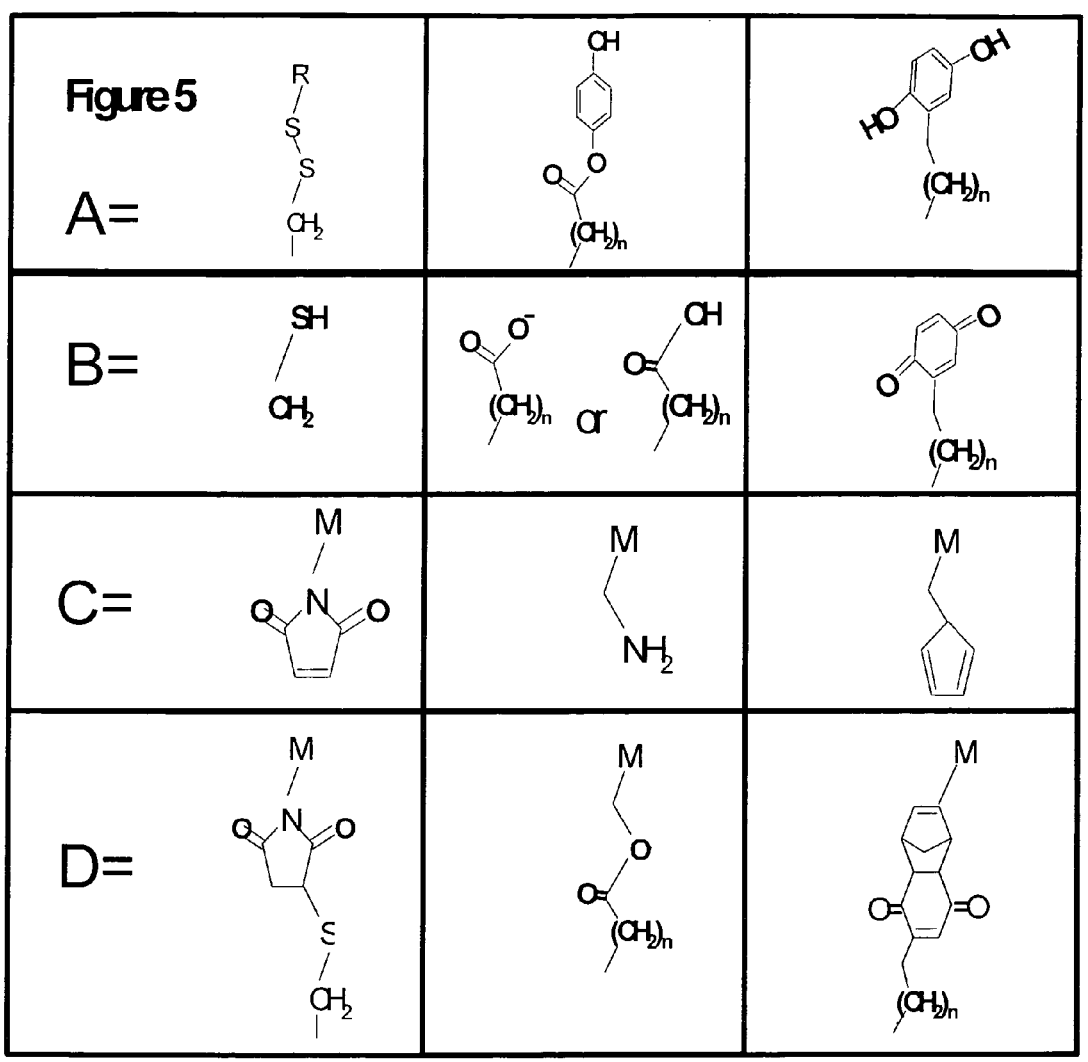
FIG. 5 are illustrations of molecule candidates A, B, C, and D according to an embodiment of the present invention.
Figure 6:
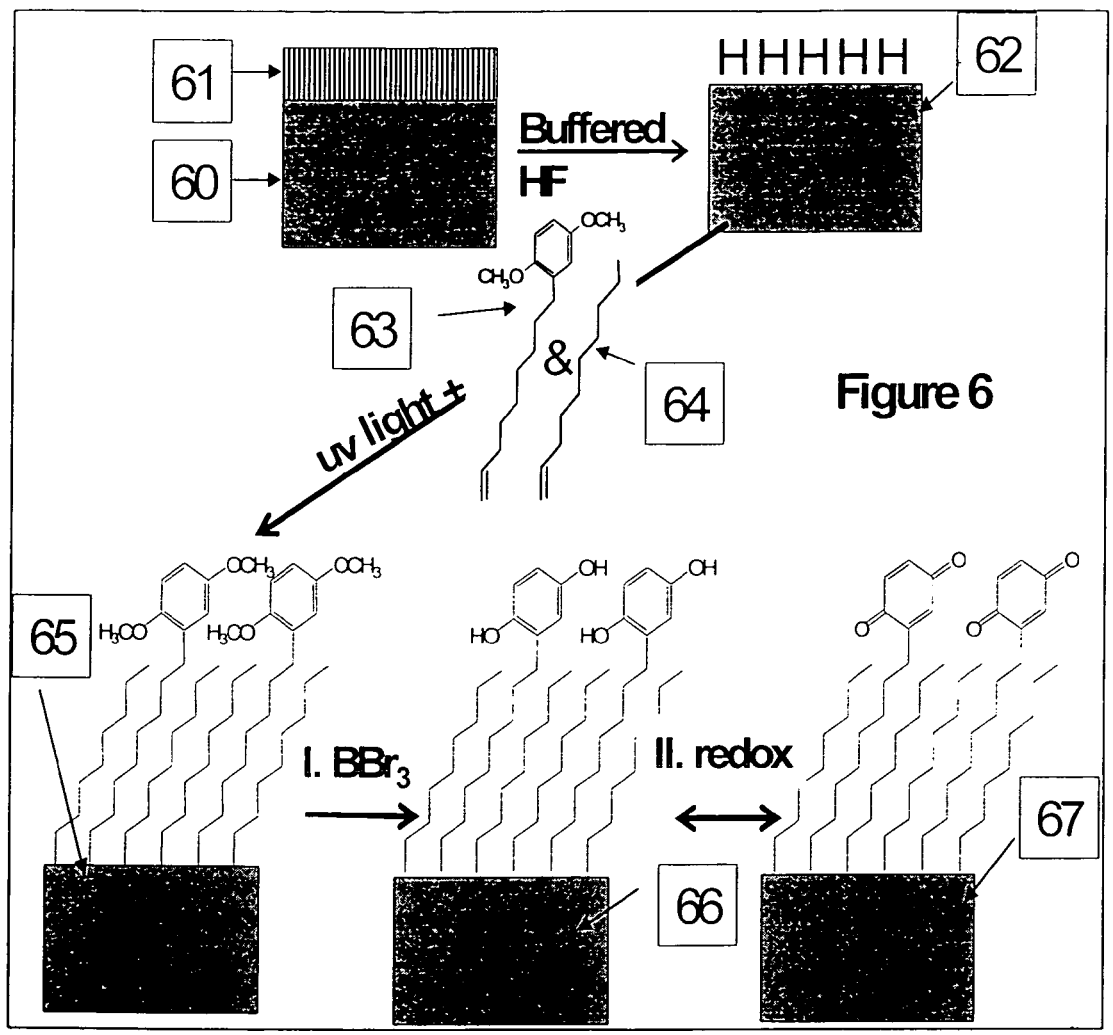
FIGS. 6-9 are simplified diagram of experimented results according to embodiments of the present invention.

In FIG. 4, we present a general scheme for selectively coating a silicon nanowire with a molecule of interest, and in FIG. 5, we outline several specific approaches by identifying various molecular components of the processes that are described in FIG. 4. These diagrams are merely examples, which should not unduly limit the scope of the claims herein. One of ordinary skill in the art would recognize many variations, modifications, and alternatives. Certain starting materials include a silicon nanowire that is coated with an insulating $SiO_2$ film 40 that is electrically contacted at either end 41 to metal electrodes. The silicon nanowire can be formed in as an array structure on a silicon on insulator wafer such as those described by Heath, et al. and possibly others. Depending upon the embodiment, there can also be other types of semiconductor material used without departing from the scope of the claims herein.

In a specific embodiment, the oxide is removed using hydrofluoric acid to produce a silicon nanowire with a surface coated with hydrogen atoms 42. Other types of etching species can also be used depending upon the application. The hydrofluoric acid is generally in liquid form and often used for semiconductor applications. Alternatively, other types of etching chemistries and types of etching processes such as plasma or dry etching techniques may be used. Preferably, the nanowire surface is substantially free from oxide without any damage to the underlying silicon bearing species, which are now terminated with hydrogen species, for subsequent reactions with a precursor species. The precursor species has been described according to this example as "Molecule A."

In a specific embodiment, the surface coated with hydrogen atoms is reacted with the Molecule A that has a terminal alkene group 43 to produce a nanowire coated with molecule A 44. Molecule A is taken from the class of molecules that can be electrochemically modified. That is, Molecule A can change from a first state to a second state electrically according to a preferred embodiment. By applying a voltage to the nanowire through one of the electrodes 45, Molecule A is oxidized, thereby producing a nanowire that is coated with Molecule B 46, which is an electroactive molecule. This step may or may not be reversible depending upon the embodiment. Molecule B reacts selectively with a second Molecule C 47 to produce a nanowire that is now coated with Molecule D. Here, the term "coated" can mean partially covering or covering an entirety of a surface region of the nanowire according to at least a specific embodiment. Other nanowires that were present in the same circuit are all coated with Molecule A, since only on this one particular nanowire was the molecule oxidized, but all of the nanowires were stripped of the insulating $SiO_2$ layer and reacted with Molecule A 43. That is, nanowires coated with Molecule A that are not oxidized do not react and form Molecule B and therefore do not react with Molecule C to produce Molecule D. The final molecule coating the particular nanowire, Molecule D, may be further reacted in order to attach the molecular electronic molecule of interest, Molecule D itself may be the molecular electronic molecule of interest. Other simple variations on this theme should be readily apparent.

As shown, the present invention provides a semiconductor based micro or nano probe device according to a specific embodiment. The device has a semiconductor substrate, which is preferably silicon or can be other like materials. The device has a plurality of nano or micro wires formed on the semiconductor substrate. Each of the nano or micro wires has a contact region and a surface region. The wires can be a plurality nanowires, microwires, or the like. As merely an example, the nanowires and their construction have been described Superlattice Nanopatterning of Wires and Complex Patterns listed under International Publication Number WO 2004/012234 A2, in the name of James Heath, et al. In a specific embodiment, the wire or wires can be made of a silicon based material such as single crystal silicon, which is doped with an impurity. The wire or wires can also be made using other types of semiconductor materials, e.g., germanium, Group III/V. Of course, the type of material and characteristic of the wire would depend highly upon the application.

The device has a substantially oxide free surface region on each of the plurality of nano or micro structures. Preferably, the oxide free surface is a silicon bearing surface with active hydrogen bonds thereon. The silicon bearing surface has been formed using an oxidized silicon material that has been etched to free the oxide layer according to preferred embodiments. Preferably, the oxide free surface has been made using an etching process, including wet or dry techniques depending upon the application.

A precursor layer formed overlying the substantially oxide free surface region on each of the plurality of nano or micro structures. Preferably, the precursor layer is formed from precursor species that are electroactive species. In a specific embodiment, the precursor species or molecule(s) can attach themselves to the silicon material and reactive species according to a specific embodiment. The precursor species or molecule has at least a first state and a second state (once attached to the silicon material) upon application of an electrical potential, as an example, e.g., preselected voltages. The first state corresponds to a reactive state and the second state corresponds to a non-reactive state. The reactive state allows for reaction and attachment and/or reaction with a selected reactive species and the non-reactive state allows for non-reaction and/or attachment with the same selected species. According to a preferred embodiment, the precursor is an R-group that has characteristics to attach to silicon bearing surfaces and form the reactive and non-reactive state upon application of a predetermined voltage.

The device has a voltage source coupled to each of the contact regions On each of the plurality of nano or micro structures. The voltage source has an opposite polarity coupled to the surface region of each of the plurality of nano or micro structures. The voltage source selectively applies either a first preselected potential or a second preselected potential to one or more of the contact regions to change a state of the precursor from the first state to the second state. Either the first state or the second state may correspond to a reactive state while the other state will correspond to a non-reactive state upon application of the preselected voltage. Further details of the present device can be found throughout the present specification and more particularly below.

In FIG. 5, we present several candidates for Molecules A, B, C, and D. As noted, these candidates are merely examples, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

EXAMPLES

To prove the principle and demonstrate aspects of the present invention, we performed certain experiments to fabricate nanostructures with molecular probes using electrochemical reactions. Completed nanostructures with molecular probes were evaluated and tested. These experiments, however, are merely examples and should not unduly limit the scope of the claims herein. One of ordinary skill in the art would recognize many variations, modifications, and alternatives.

In FIGS. 6, 7, 8 and 9, we present an experimental approach and accompanying experimental data demonstrating aspects of the present invention. The experimental data and approach are merely examples and should not unduly limit the scope of the claims herein. One of ordinary skill in the art would recognize many variations, modifications, and alternatives. Certain details of these experiments have been provided below.

Several silicon wires were patterned on top of a 150 micrometer thick $SiO_2$ coated silicon wafer using standard lithographic patterning procedures and a large region of silicon was also patterned for contact angle measurements. All silicon wires (only one illustrated 60) were initially covered with an insulating $SiO_2$ layer 61. This was removed by immersing the wafer into buffered hydrofluoric acid (HF) for ~10 seconds, producing a hydrogen-atom coated silicon wire. The wafer was then mounted into a chamber of an inert environment (Ar) apparatus to prevent the silicon wire surfaces from degrading back to having an $SiO_2$ coverage. The wafer was then immersed into a tetrahydrofuran (THF) solution containing two molecules, p-dimethoxy-m-8-nonene-benzene 63 and 1-nonene 64, at a 2:1 molar ratio. The wafer/solution was irradiated with UV light for 20 minutes to produce silicon wires coated with p-dimethoxy-m-nonane-benzne and nonane. These wires were now air stable and could be removed from the inert atmosphere apparatus. The contact angle of water upon the dimethoxybenzene coated silicon surface was measured to be 80°. The dimethoxy groups were then converted to alcohols by the addition of $BBr_3$ to produce silicon wires that were coated with a mixture of hydroquinone and nonane 66. This chemistry could be monitored by again measuring the contact angle of a water droplet on the silicon surface. This was measured to be 50°, consistent with the more hydrophilic hydroquinone coated silicon surface 66.

Figure 7:
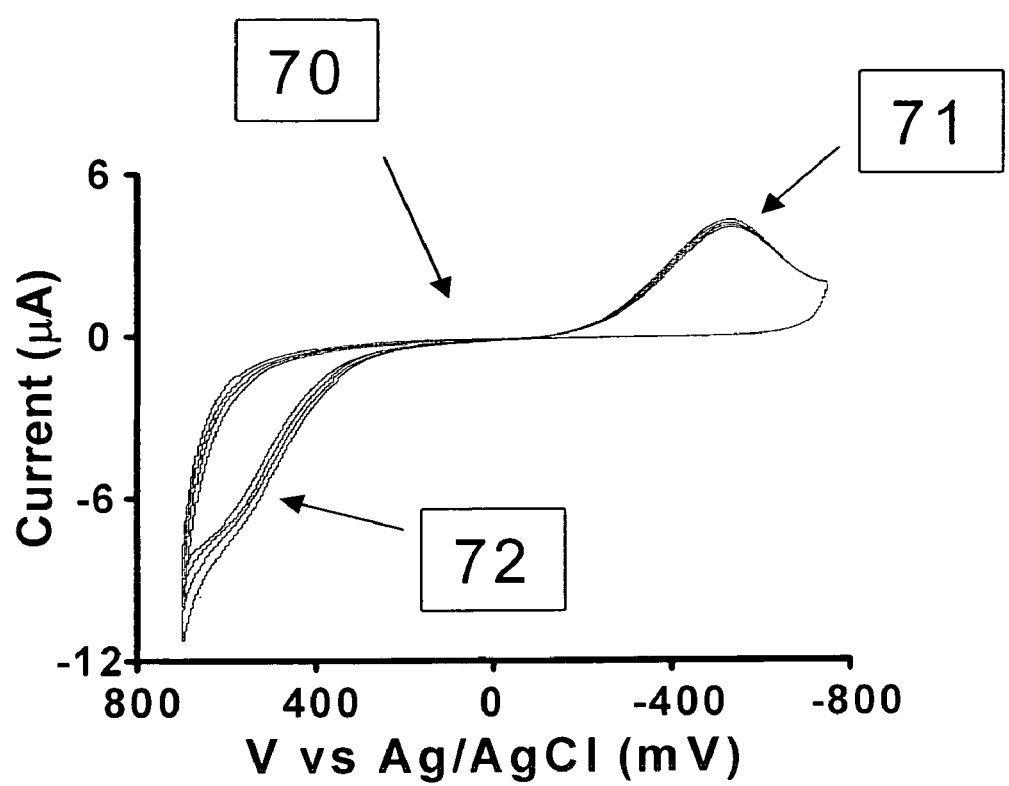
Figure 8:
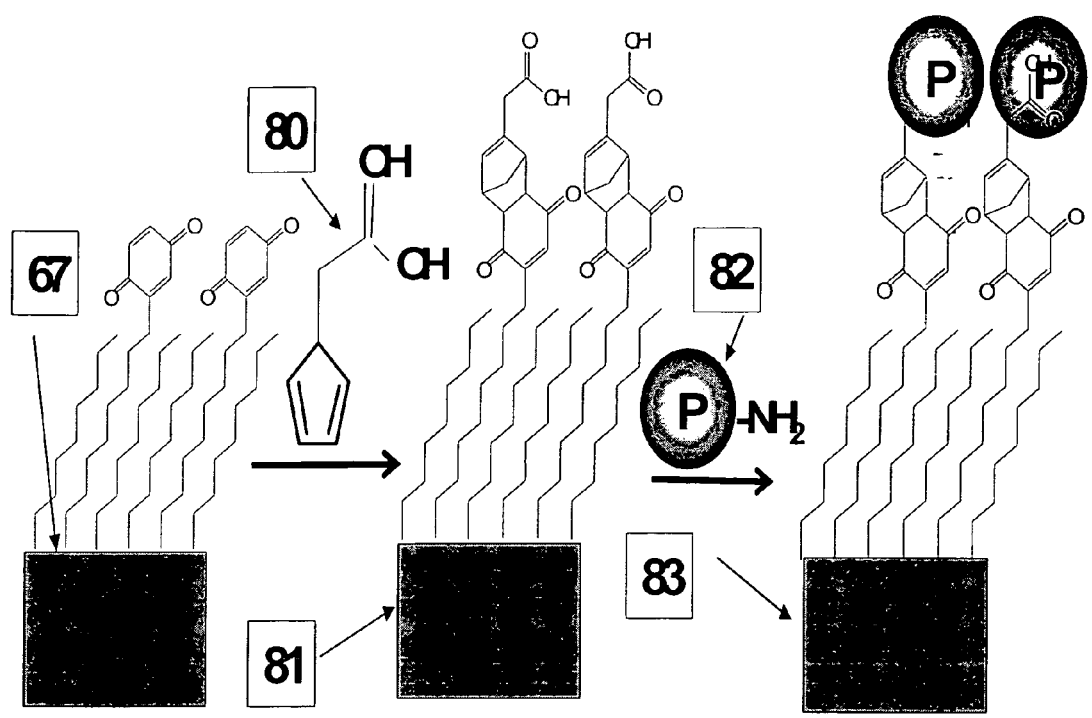
Figure 9:
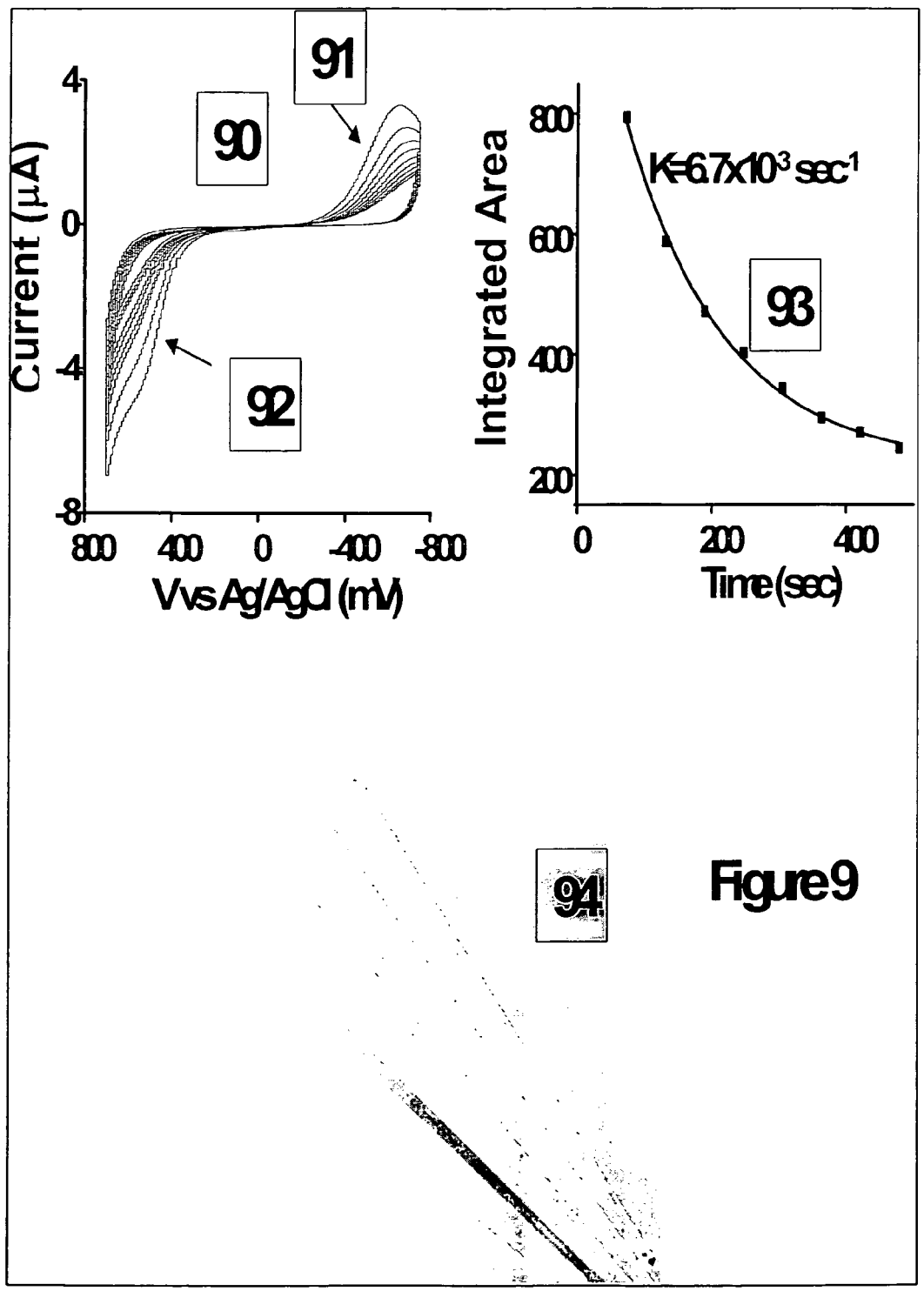

Referring now to FIG. 7, electrical connection was then made to the wires, and using a potentiostat, a cyclic voltammogram 70 was recorded. The voltammogram revealed both forward (oxidation) 71 and reverse (reduction) waves 72 indicating the a reversible oxidation/reduction of the electrode surface was possible. This is interpreted as the redox driving cycling between the hydroquinone coated silicon wires 66) and the quinone coated silicon wires 67. One of the wires, as well as the larger region of silicon surface, was again oxidized, but in the presence of a carboxylic acid functionalized cyclopentadiene 80. Cyclic voltammograms were again measured to follow the subsequent chemistry 90. The oxidation wave 91 and the reduction wave 92 disappeared over a period of a couple hundred seconds 93, generating a reaction rate constant of about $6.7 \times 10^{-3}$ sec$^{-1}$. This presumably correlated with the reaction of the cyclopentadienyl carboxylate 80 with the quinone-coated silicon surface 67 to produce a carboxylate coated silicon surface 81. The contact angle of a water droplet was again measured on this chemically modified surface, and was found to be 75°. All of the wires except 1 were retained as hydroquinone coated wires 66. All wires were then exposed to a solution containing a fluorescently active bead that also was coated with amines 82. These amine groups reacted with the carboxylate coated Si wire 81, thereby rendering that wire fluorescent 94. As expected, none of the other wires were fluorescent, since they remained coated with the non-reactive hydroquinone 66. The present experiments have demonstrated aspects of the present invention.

Of course, one of ordinary skill in the art would recognize many variations, alternatives, and modifications.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing molecular probes on semiconductor microstructures or nanostructures, the method comprising
   providing at least one microstructures or nanostructure, the microstructures or nanostructure comprising a surface region;
   processing the surface region to form a hydrogenated surface on a portion of the surface region of the microstructure or nanostructure;
   forming one or more electro active molecules overlying the surface region of the microstructure or nanostructure,
   selecting one or more microstructures or nanostructures by applying an electrical voltage from an external source with respect to a reference electrode to the one or more selected microstructures or nanostructures; and
   forming one or more reactive sites on a portion of the one or more of the selected microstructures or nanostructures.

2. The method of claim 1 wherein the portion is an entirety of the surface region.

3. The method of claim 1 wherein the microstructures or nano structure comprises a semiconductor material is selected from silicon, germanium, and Group III/V materials.

4. The method of claim 1 wherein the microstructure or nanostructure comprises silicon.

5. The method of claim 4 wherein the silicon micro or nano structures have a dimension ranging from no greater than about thirty micrometers to about five nanometers.

6. The method of claim 4 wherein the microstructure or nanostructure consisting essentially of semiconductor material.

7. The method of claim 4 wherein the processing comprises subjecting the microstructure or nanostructure to an etchant to remove any surface oxide thereon.

8. The method of claim 7 wherein the etchant comprising a fluorine bearing species.

9. The method of claim 7 wherein the etchant is selected from BOE or HF.

10. The method of claim 1 wherein the hydrogenated surface comprises Si—H bonds.

11. The method of claim 1 wherein the electroactive molecule is a precursor layer overlying the portion of the hydrogenated surface region, the precursor layer being capable of selectively attracting one or more reactive molecules thereon.

12. The method of claim 11 wherein the precursor layer is adapted to change from one oxidation state to another oxidation state upon application of a voltage potential to the microstructure or nanostructure.

13. The method of claim 11 wherein the precursor layer comprises one or more molecules is within a class of species that can be electrochemically modified from at least a first state to a second state.

14. The method of claim 1 wherein the electroactive molecule is selected from a family of quinone derivatives.

15. The method of claim 1 wherein the electroactive molecule is provided in a fluid immersing a portion of the nanostructure.

16. The method of claim 1 wherein the nanostructure comprises a first electrode coupled to a first end of the nanostructure, the first end coupled to a voltage source, other portions of the microstructure or nanostructure being coupled to an opposite polarity of the voltage source.

17. The method of claim 16 wherein the voltage source comprises a direct current source.

18. The method of claim 16 wherein the voltage source comprises an alternating current source.

19. The method of claim 1 wherein the microstructure or nanostructure is provided on a semiconductor substrate.

20. The method of claim 1 wherein the microstructure or nanostructure is patterned on silicon on insulator material.

21. The method of claim 1 further comprising activating the electroactive molecule and attaching a selected protein to the activated molecule while preventing attachment of the selected protein to non-activated electroactive molecules.

22. The method of claim 1 further comprising activating the electroactive molecule and attaching a selected DNA to the activated molecule while preventing attachment of the selected DNA to non-activated electroactive molecule.

23. A method for manufacturing molecular probes on semiconductor nanostructures, the method comprising
   providing a plurality of nanowires structures, the plurality of nanowires structures comprising a semiconductor material, each of the nanowire structures comprising a surface region;
   forming a precursor layer overlying the surface region of each of the nanowire structures;
   immersing the plurality of nanowire structures in an fluid, the fluid being an electrolyte including a plurality of reactive molecules;
   selectively applying an electrical voltage from an external source with respect to a reference electrode to one or more of the nanowires from the plurality of nanowires, changing a potential of the selected nanowire or nanowires;
   forming one or more reactive sites on a portion of the precursor layer by electrochemically changing the portion of the precursor layer on the surface region of the selected one or more nanowire structures from the plurality of nanowires structures to program electrochemically the one or more selected nanowire structures;
   initiating one or more chemical bonds between one end of a electroactive molecules from a plurality of electroactive molecules on the portion of precursor layer to at least one of the reactive molecules through the fluid; and
   continuing to apply the reactive molecules to the surface region of the one or more selected nanowire structures.

24. The method of claim 23 wherein the semiconductor material is selected from silicon, germanium, and group III/V materials.

25. The method of claim 23 wherein the plurality of nanowire structures each having a dimension ranging from about five nanometers to less than one micron.

26. The method of claim 23 wherein the nanowire structures consisting essentially of semiconductor material.

27. The method of claim 23 further comprising subjecting the plurality of nanowire structures to an etchant to remove any surface oxide thereon.

28. The method of claim 27 wherein the etchant comprising a fluorine bearing species.

29. The method of claim 28 wherein the etchant is selected from BOE or HF.

30. The method of claim 29 wherein the semiconductor material is a silicon bearing material and the plurality of nanowire structures comprise surface regions having Si—H bonds after the step of subjecting the plurality of nanowire structures to the etchant.

31. The method of claim 23 wherein the precursor layer comprises Si-Ch2-CH2-R, wherein Si is derived from the surface region of the semiconductor material and R is an electroactive precursor molecule.

32. The method of claim 23 wherein the potential is changed relative to a ground potential or the potential is negative relative to a ground potential.

33. The method of claim 23 wherein the electroactive molecule is within a class of species that can be electrochemically modified from at least a first state to a second state.

34. The method of claim 23 wherein the electroactive molecule is selected from a family of quinone derivatives.

35. The method of claim 23 wherein the one or more reactive sites is derived from the precursor layer overlying the surface region of the selected one or more nanowire structures.

36. The method of claim 23 wherein the reactive molecules are provided in a fluid immersing a portion of the plurality of nanowire structures.

37. The method of claim 23 wherein each of the nanowire structures comprising a first electrode coupled to a first end of the nanowire structure, the first end being coupled to a voltage source, and other portions of the nanowire structure being coupled to an opposite polarity of the voltage source to the fluid.

38. The method of claim 37 wherein the voltage source comprises a direct current source.

39. The method of claim 37 wherein the voltage source comprises an alternating current source.

40. The method of claim 23 wherein the continuing occurs while the electrical voltage remains on the selected one or more nanowire structures.

41. The method of claim 23 wherein the plurality of nanowire structures comprises at least 20 wires, each of the 20 wires is in parallel arrangement with each other.

42. The method of claim 23 further comprising removing the electrical voltage from one or more of the nanowires structures from the plurality of nanowire structures.

43. The method of claim 23 wherein the electroactive molecule covers an entirety of the surface region of the one or more selected nanowire structures.

44. The method of claim 23 wherein the electroactive molecule covers a portion of the surface region of the one or more selected nanowire structures.

45. The method of claim 23 wherein the plurality of nanowire structures are provided on a semiconductor substrate.

* * * * *